(12) United States Patent
Ido et al.

(10) Patent No.: US 7,846,498 B2
(45) Date of Patent: Dec. 7, 2010

(54) RESIN PRODUCT, PRODUCTION METHOD FOR THE SAME, AND DEPOSITION METHOD FOR A METALLIC COATING

(75) Inventors: Takayasu Ido, Aichi-ken (JP); Hiroshi Watarai, Aichi-ken (JP)

(73) Assignee: Toyoda Gosei Co., Ltd., Aichi-pref. (JP)

( * ) Notice: Subject to any disclaimer, the term of this patent is extended or adjusted under 35 U.S.C. 154(b) by 883 days.

(21) Appl. No.: 11/585,148

(22) Filed: Oct. 24, 2006

(65) Prior Publication Data

US 2007/0098967 A1 May 3, 2007

(30) Foreign Application Priority Data

Oct. 31, 2005 (JP) ............................. 2005-317070
Aug. 24, 2006 (JP) ............................. 2006-227916

(51) Int. Cl.
*C23C 16/00* (2006.01)

(52) U.S. Cl. .................................. 427/250; 427/248.1

(58) Field of Classification Search ................. 427/250, 427/248.1
See application file for complete search history.

(56) References Cited

U.S. PATENT DOCUMENTS

| 6,656,556 B2 * | 12/2003 | Morikawa et al. ........... 428/40.1 |
| 6,767,589 B1 * | 7/2004 | Gabrys ........................ 427/404 |
| 7,226,187 B2 * | 6/2007 | Yamazaki et al. ........... 362/257 |

FOREIGN PATENT DOCUMENTS

| JP | U-S63-030136 | 2/1988 |
| JP | A-H07-316782 | 12/1995 |
| JP | A-H09-070920 | 3/1997 |
| WO | WO 99/33649 | 7/1999 |

\* cited by examiner

*Primary Examiner*—Timothy Meeks
*Assistant Examiner*—Kelly M Gambetta
(74) *Attorney, Agent, or Firm*—Posz Law Group, PLC

(57) ABSTRACT

The present invention provides a metallic coating having a sheen and discontinuous structure and a resin product having the metallic coating by using a physical vapor deposition method at high productivity and low cost.

3 Claims, 4 Drawing Sheets

RESIN PRODUCT, PRODUCTION METHOD FOR THE SAME, AND DEPOSITION METHOD FOR A METALLIC COATING

INCORPORATION BY REFERENCE

The present application claims priority under 35 U.S.C. §119 to Japanese Patent Application Nos. 2005-317070 filed on Oct. 31, 2005 and 2006-227916 filed on Aug. 24, 2006. The contents of these applications are incorporated herein by reference in their entireties.

TECHNICAL FIELD

The present invention relates to a resin product having a metallic coating that has a sheen and a discontinuous structure, a manufacturing method for the same, and a deposition method for the metallic coating, and is used for a millimeter wave radar apparatus cover and other various uses.

BACKGROUND OF THE INVENTION

In order to warn a driver that the automobile is approaching an object in its vicinity, providing a millimeter wave radar apparatus for measuring distance on each part of an automobile, for example, behind the radiator grill, the side moldings, the back panels, and the like, is under study. However, in the case in which the radiator grill and the like are provided with a sheen by using a metallic coating, this metallic coating blocks or greatly attenuates the millimeter waves. Thus, the path of the millimeter waves of the radar apparatus must be covered by a radar apparatus cover that has a sheen and has millimeter wave transparency. In order for the metallic coating to be transparent to millimeter waves, a discontinuous structure is necessary. In this discontinuous structure, the metallic coating does not form one continuous surface, but instead it has a structure (sea-island structure) in which many fine metal particles are spread over the surface in a state in which they are slightly separated from each other or have portions thereof in contact so as to coalesce into islands.

The following methods are conventionally known for forming metallic coatings having a sheen and a discontinuous structure by using a physical vapor deposition method. The industrial applicability of these methods has progressed with the goal of attaining, as coating characteristics, the effects of an improvement in corrosion resistance, conforming to stresses, and transparency to high frequency electromagnetic waves.

(1) In many conventional methods, in order to cause the metallic coating to become discontinuous to a degree that does not lose the sheen, a physical vapor deposition method is used to form a metallic coating that has a sheen and a continuous structure, and subsequently, a post-processing treatment, for example, etching using masks, is applied. However, it cannot be said that this method is optimal in terms of the treatment costs.

(2) In addition, a method has been reported in which the treatment is stopped in a state of an ultra-thin film before metallic coating formation by a physical vapor deposition method to obtain a discontinuous structure. However, in this method, a metallic sheen that is adequate in terms of external appearance cannot be obtained.

(3) As a method for solving these problems, the formation of an In or Sn coating by using a physical vapor deposition method has been reported in the following patent documents: Japanese Examined Utility Model No. JP-U-S63-30136, Japanese Patent Application Publication No. JP-A-H7-316782, and Japanese Translation of the PCT International Application No.2001-526983. In these methods, a post-processing treatment is not necessary, and it is possible to form a discontinuous structure in a state that preserves a metallic sheen. However, when taking into account coating-thickness dependence, a sufficiently stable discontinuous structure cannot be maintained.

(4) In addition, in Japanese Patent Application Publication No. JP-A-H9-70920, the present applicants have proposed a resin product made such that a base coating layer of an acrylic urethane is formed on a resin base material, a Cr thin film layer having a thickness of 150 to 800 Å is formed by a vacuum vapor deposition method on the base coating layer, and the Cr thin film layer acquires crystal grain boundaries thereby. However, although a discontinuous structure could be formed that conforms to the deformations of the base material without fracturing, a more highly resistant discontinuous coating could not be obtained. In addition, the scope of the manufacturing conditions was limited, productivity was poor, and the control of the conditions was complicated.

SUMMARY OF THE INVENTION

Thus, it is an object of the present invention to obtain a metallic coating that has a sheen and discontinuous structure at high productivity and low cost even when using a physical vapor deposition method.

In order to solve the problems described above, the present invention employs the following means [1] to [3]:

[1] A resin product which comprises a resin base material; an inorganic undercoating that comprises an inorganic compound deposited on the resin base material; and a metallic coating deposited on the inorganic undercoating by using a physical vapor deposition method, the metallic coating comprising at least one of chromium (Cr) and indium (In) and having a sheen and a discontinuous structure.

[2] The manufacturing method for a resin product which comprises the steps of forming an inorganic undercoating that comprises an inorganic compound on the resin base material; and depositing a metallic coating on the inorganic undercoating by using a physical vapor deposition method, the metallic coating comprising at least one of Cr and In and having a sheen and a discontinuous structure.

[3] A deposition method for a metallic coating which comprises the step of depositing a metallic coating on the inorganic undercoating by using a physical vapor deposition method, the metallic coating comprising at least one of Cr and In and having a sheen and a discontinuous structure.

Each of the elements in these means is illustrated in the following examples.

1. Resin Base Material

The form of the resin base material is not limited in particular, but a base board, a sheet material, a film and the like may be mentioned as examples. The resin for the base material is not limited in particular, but a thermoplastic resin is preferable, and PCs (polycarbonates), acrylic resins, polystyrenes, PVCs (polyvinyl chlorides), and polyurethanes may be mentioned as examples.

2. Inorganic Undercoating

The material for an inorganic undercoating that includes an inorganic compound is not limited in particular, but the following examples may be mentioned. Note that the inorganic undercoating may include small amounts (for example, 20 wt. % or less) of organic compounds in the inorganic compounds.

(a) A Thin Film of a Metallic Compound

Titanium compounds such as titanium oxide (TiO, $TiO_2$, $Ti_3O_5$ and the like)

Silicon compounds such as silicon oxide (SiO, $SiO_2$ and the like), silicon nitride ($Si_3N_4$ and the like)

Aluminum compounds such as aluminum oxide ($Al_2O_3$)

Iron compounds such as iron oxide ($Fe_2O_3$)

Cerium compounds such as ceric oxide (CeO)

Zirconium compounds such as zirconium oxide (ZrO)

Zinc compounds such as zinc sulfide (ZnS)

(b) A Coating Film of an Inorganic Coating Material

A coating film made of an inorganic coating material in which silicon, amorphous $TiO_2$ or the like (additionally, the metallic compounds illustrated above) is used as the principal component.

The deposition method for the inorganic undercoating is not limited in particular, but in the case of a thin film made of the metallic compounds in (a) described above, a physical vapor deposition method may be mentioned as an example, and in the case of a coating film made of the inorganic coating materials in (b) described above, a spray coating or the like may be mentioned as an example. The physical vapor deposition method is not particular limited, but a vacuum vapor deposition method, molecular beam deposition, ion plating, ion beam deposition, sputtering, and the like may be mentioned as examples. In the case of a coating film made of an inorganic coating material, baking after coating is preferable.

The coating thickness of the inorganic undercoating is not limited in particular, but in the case of a physical vapor deposition method using any of the metallic compounds in (a) described above, about 7 to 100 nm is preferable, and in the case of a spray coating using any of the coating materials in (b) described above, about 0.5 to 3 μm is preferable. It is considered that the function of providing the metallic coating with a discontinuous structure is present even at less than 7 nm, but the continuity (leveling) of the undercoating itself is frequently poor, and the original object of covering the resin base material with an inorganic material becomes difficult to attain.

3. A Metallic Coating

The thickness of the metallic coating is not limited in particular, but 10 to 100 nm is preferable. The reason for this is that when the coating thickness is less than 10 nm, the sheen tends to decrease, while the coating thickness exceeds 100 nm, the electrical resistance tends to become low, and for example, the millimeter wave transparency tends to degrade.

The physical vapor deposition method, which is a deposition method for a metallic coating, is not limited in particular, but a vacuum vapor deposition method, molecular beam deposition, ion plating, ion beam deposition, sputtering and the like may be mentioned as examples.

4. Other Films and the Like

Preferably, a protective film is formed on the metallic coating in order to protect this metallic coating. In the case in which the lower surface side of the resin base material is a design surface, a press coating film or the like may be formed as a protective film on the metallic coating. Furthermore, a resin backing material may be injection molded onto the press coating. In contrast, in the case in which the upper surface side of the metallic coating is a design surface, a clear top coating film or the like may be formed as a protective film on the metallic coating.

5. Types (Uses) of a Resin Product

Because the metallic coating is discontinuous, the metallic coating has a high electrical resistance. Thereby, properties such as millimeter wave transparency and a lightning protecting capacity are present. Furthermore, because of its discontinuity, the spread of corrosion is suppressed, so that corrosion resistance is present. In addition, the discontinuous metallic coating readily conforms to the curved surfaces of the resin base material. The types (uses) of resin products that can be realized due to having these qualities are not limited in particular, but the following may be mentioned as examples:

(a) Use in a millimeter wave radar apparatus cover may be mentioned as an example of the use for taking advantage of the millimeter wave transparency. The part to which this cover is applied is not limited in particular, but use in an external application product for an automobile is preferable, and in particular, suitable for a radiator grill, a grill cover, side moldings, back panels, bumpers, emblems, and the like.

(b) Use in an umbrella or the like may be mentioned as an example of the use for taking advantage of the lightning protecting capacity.

(c) Use in a printed circuit board may be mentioned as an example of the use for taking advantage of the property that only treated areas are electrically insulating.

(d) Use in exterior parts of an automobile such as emblems, radiator grills, and shiny moldings maybe mentioned as an example of the use for taking advantage of the corrosion resistance characteristic.

(e) Use in elastic shiny moldings may be mentioned as an example of the use for taking advantage of conforming to curved surfaces.

(f) In addition, use in containers for use in a microwave oven may be mentioned as an example of the use for taking advantage of the infrared transparency.

6. The Mechanism by which the Metallic Coating Acquires a Discontinuous Structure (a Sea-island Structure)

When the metallic coating is deposited by a physical vapor deposition method either directly on a resin base material or over an organic undercoating, this metallic coating has a sheen, but also acquires a continuous structure. In contrast, it has been turned out that when the metallic coating is deposited by a physical vapor deposition method on an inorganic undercoating, the metallic coating readily acquires a sheen and a discontinuous structure (a sea-island structure). It is conjectured that this occurs due to the following mechanism.

It is considered that an important factor is that the metal particles that have landed on the resin base material select a Volmer-Weber growth mode if they have a large degree of freedom to migrate on this resin base material, and in the end readily acquire the discontinuous structure. Alternatively, it is considered that if the metal particles have no degree of freedom to migrate, the metal particles stop at the location where they have landed, and select a flat Frank-Von der Merwe growth mode, and in the end readily acquire a continuous structure. For example, depositing the metallic coating by using a sputtering method, in which the energy that the metal particles acquire is higher than the energy acquired by using a vacuum vapor deposition method, readily yields a continuous structure. It is considered that the reason for this is that the metal particles are readily stuck into the resin base material. In addition, when the temperature of the resin base material is made high, the metallic coating readily acquires a discontinuous structure in addition to growing into spheres. It is considered that the reason for this is that the metal particles do not stop where they land, and they acquire the energy for escaping from the binding force that would adhere them.

In a physical vapor deposition method, the metal particles land on the base material in a reactive state (a pure metal atomic state) that would not allow them to be ordinarily present at atmospheric pressure (in the presence of oxygen). The metal particles immediately react to form compounds when oxygen, nitrogen or the like are present in the vicinity. In contrast, when considering organic and inorganic base material surfaces, generally an organic network of C—C, C—O, C—H or the like are chemically more unstable than an inorganic network of Si—O, Ti—O or the like. In fact, when comparing weather resistance capacity, alkali resistance, and acid resistance capacity, among the inorganic coating materials and organic coating materials, clearly the inorganic coatings have a lower degree of degradation, and this means that they are chemically stable, that is, the inorganic coatings form an unreactive and durable network.

Therefore, it is considered that there is the possibility that some sort of chemical interference (an absorbing action or an affinity) is acting between the metal particles and the resin base material, and in particular, operating on the metal particles that first land on the resin base material, and that this acts to inhibit the diffusion movement of the metal particles over the resin base material. This inhibiting is significant when the base material surface is organic and in an active state. Thus, it is considered that by making the base material surface inorganic and in an unreactive state, this inhibiting will be decreased, the sea-island morphology will be promoted, and finally a discontinuous structure will be obtained.

According to the present invention, a metallic coating that has a sheen and has a discontinuous structure can be obtained at high productivity and low cost even by a physical vapor deposition method.

DETAILED DESCRIPTION OF THE INVENTION

Figure 1:
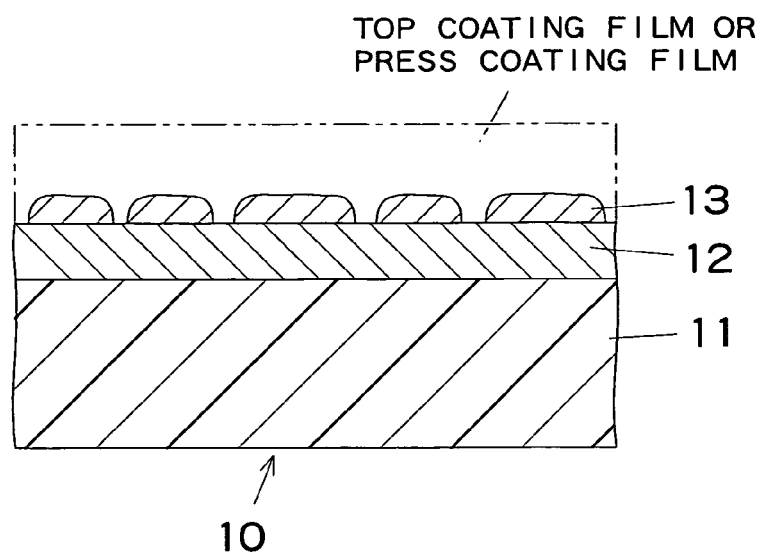
FIG. 1 is a cross-sectional view showing the resin product in an example of the present invention.

A resin product 10 (for example, a millimeter wave radar apparatus cover) shown in FIG. 1 includes a plate-shaped resin base material 11; an inorganic undercoating 12 that includes inorganic compounds that are deposited on the resin base material 11; and a metallic coating 13 that has a sheen and has a discontinuous structure, and has been deposited onto the inorganic undercoating 12 by using a physical vapor deposition method. On the metallic coating 13, a top coating film and a press coating film, or the like are formed as a protective film.

This resin product 10 is produced by the steps described below. The resin base material 11 has a plate-shape that is 5 mm thick, and is made of, for example, a PC (polycarbonate).

(1) A Step in which an Inorganic Undercoating 12, which Includes an Inorganic Compound, is Deposited on the Resin Base Material 11

As shown in the following TABLE 1, in the inorganic undercoating 12 in each of the examples, the thin film made of a metallic compound is deposited by using a vacuum vapor deposition, and a coating film made of an inorganic coating material is deposited by using a spray coating.

(2) A Step in which a Metallic Coating 13 having a Sheen and a Discontinuous Structure is Deposited on the Inorganic Undercoating 12 by Using a Physical Vapor Deposition Method As shown in the following TABLE 1, the metallic coating of the examples is one in which Cr or In is deposited by vacuum vapor deposition or sputtering.

The conditions for the vacuum vapor deposition are not limited in particular, but in the following examples, a vacuum vapor deposition apparatus made by Shincron was used, electron beam heating was used as a heating method, the attained degree of vacuum was $5.0 \times 10^{-3}$ Pa, and the deposition was carried out with the chamber at room temperature.

The conditions for the sputtering are not limited in particular, but in the following examples, a sputtering apparatus made by Kawai Optics was used, and using a DC magnetron method, the attained degree of vacuum was $5.0 \times 10^{-3}$ Pa, and the deposition was carried out with the chamber at room temperature.

EXAMPLES

As shown in the following TABLE 1, resin product samples for the examples and the comparative examples of groups No. 1 to No. 10 were produced.

TABLE 1

Figure 2:
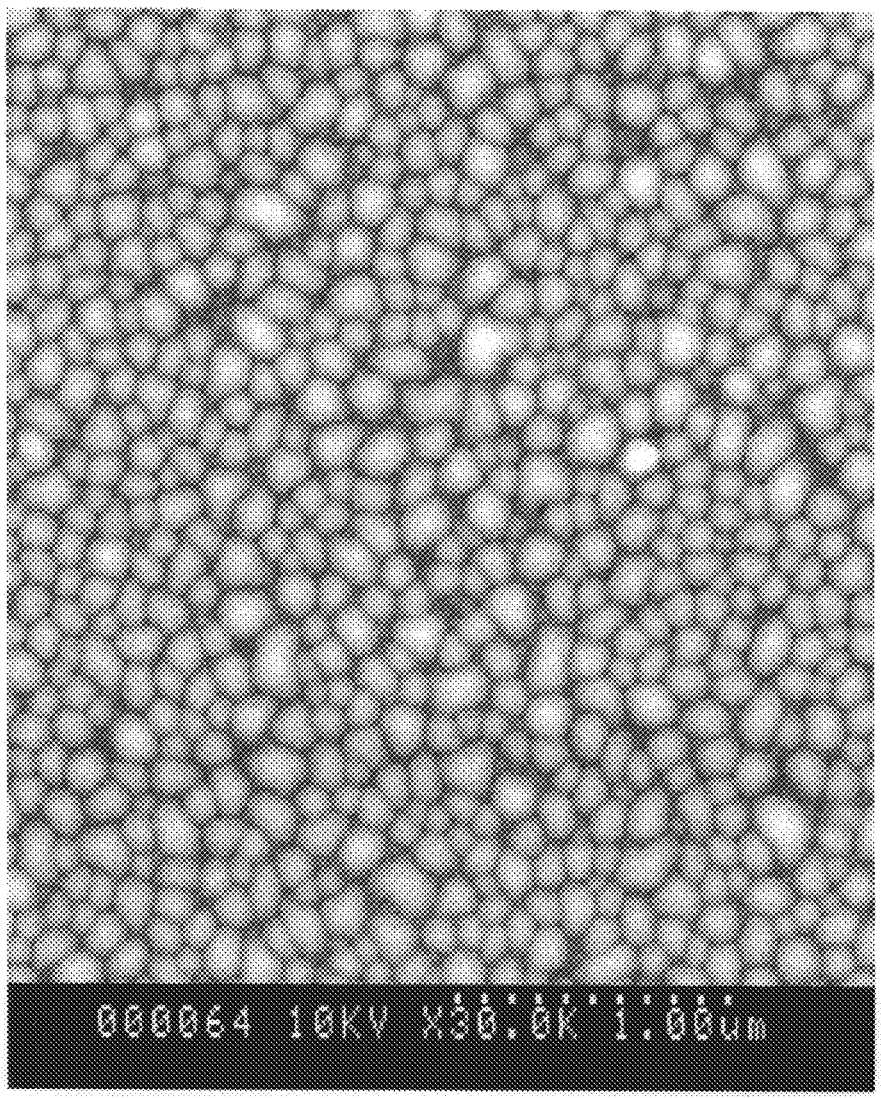
FIG. 2 is a microscopic photograph of the In coating of the example in Group 2, which has an undercoating of $SiO_2$, and a light transmittance of 4.02%.
Figure 3:
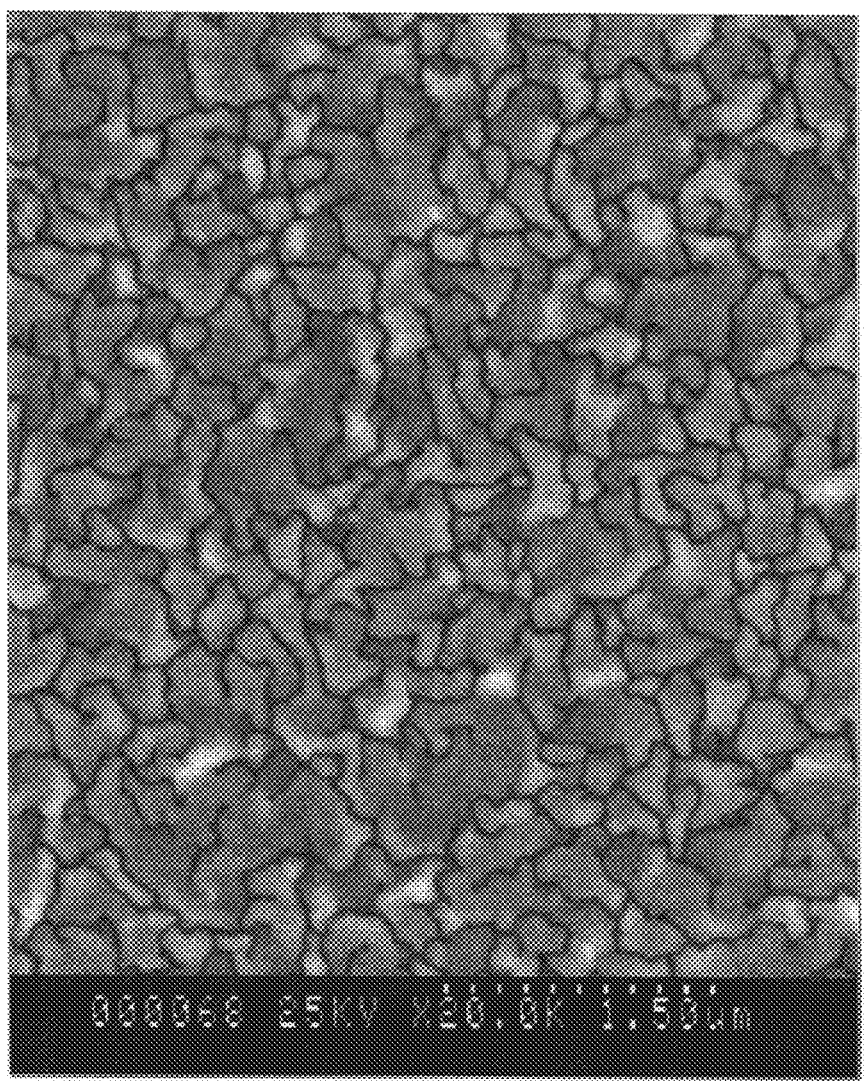
FIG. 3 is a microscopic photograph of the In coating of the comparative example in Group 2, which has an undercoating of an acrylic coating material, and a light transmittance of 3.99%.
Figure 4:
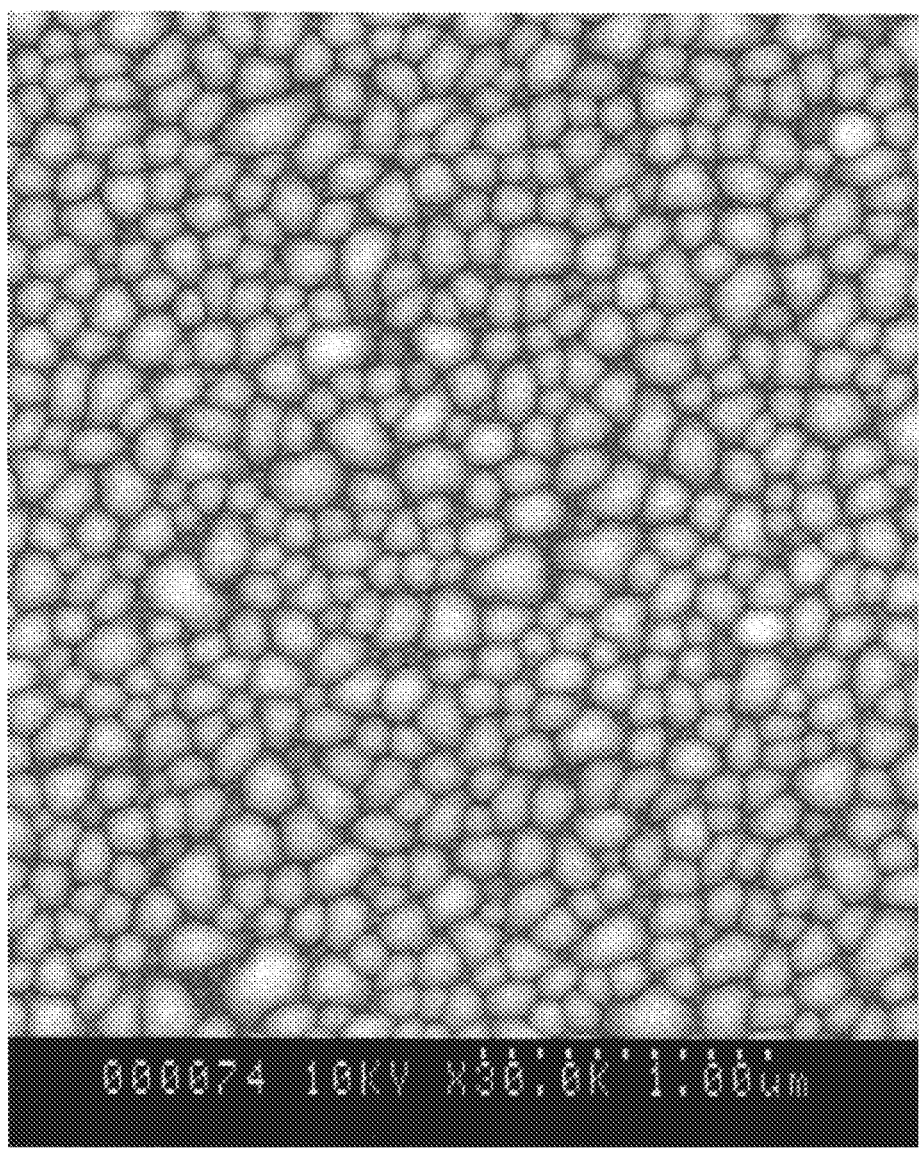
FIG. 4 is a microscopic photograph of the In coating of the example in Group 3, which has an undercoating of $TiO_2$, and a light transmittance of 3.92%.

| Group No. | | Base Material | Undercoating | | Metallic Coating | | Test Result | | | |
| | | | Deposition Method | Material | Deposition Method | Material | Light Transmittance (@ 555 nm) | Electrical Resistance ($\Omega/\square$) | Result | Macro Photograph of Morphology |
|---|---|---|---|---|---|---|---|---|---|---|
| 1 | Example | Extrusion formed PC | Vapor Deposition | $SiO_2$ | Vapor Deposition | Cr | 26~29% | 1.1E + 04 | $SiO_2$ undercoating effective | — |
| | Comparative Example | ↑ | — | Directly on base material | | | | 1.9E + 03 | | — |
| | Comparative Example | ↑ | Coating | Polyester | | | | 9.0E + 02 | | — |
| 2 | Example | Extrusion formed PC | Vapor Deposition | $SiO_2$ | Vapor Deposition | In | 4.02% | 6.38E + 12 | $SiO_2$ undercoating effective and $TiO_2$ undercoating effective | FIG. 2 |
| | Comparative Example | ↑ | — | Directly on base material | | | 3.89% | 3.26E + 01 | | — |
| | Comparative Example | ↑ | Coating | Acrylic | | | 3.99% | 3.83E + 01 | | FIG. 3 |
| 3 | Example | ↑ | Vapor Deposition | $TiO_2$ | Vapor Deposition | In | 3.92% | 5.46E + 11 | | FIG. 4 |

TABLE 1-continued

| | | Undercoating | | Metallic Coating | | Test Result | | | Macro |
|---|---|---|---|---|---|---|---|---|---|
| Group No. | Base Material | Deposition Method | Material | Deposition Method | Material | Light Transmittance (@ 555 nm) | Electrical Resistance (Ω/□) | Result | Photograph of Morphology |
| 4 | Example | ↑ | Coating | Inorganic coating (silicon base) | Sputtering | In | 8% 14% 23% | 3.1~4.6E + 04 0.15~3.3E + 09 3.4~8.5E + 10 | SiO$_2$ undercoating effective | — — — |
| | Comparative Example | ↑ | Coating | Acrylic and Polyester | | | 8% 14% 23% | 1.1~2.7E + 03 1.4~8.0E + 04 0.37~2.5E + 06 | | — — — |
| | Comparative Example | Glass material | — | Directly on base material | | | 8% 14% 23% | 1.7~3.5E + 04 2.0~2.1E + 08 4.0~9.0E + 09 | | — — — |
| 5 | Example | Extrusion formed PC | Coating | Inorganic coating (silicon base) | Vapor Deposition | Cr | 26~29% | 1.6E + 04 | SiO$_2$ undercoating effective | — |
| | Comparative Example | ↑ | Coating | acrylic | | | | 8.4E + 02 | — | |
| | Comparative Example | ↑ | — | Directly on base material | | | | 1.9E + 03 | | — |
| 6 | Example | Extrusion formed PC | Coating | Inorganic coating (silicon base)/ high hydrophilic | Sputtering | In | 8% 23% | 4.5E + 04 8.5E + 10 | Base material surface character (hydrophilic) ineffective | — |
| | Example | ↑ | Coating | Inorganic coating (silicon base)/ medium hydrophilic | | | 8% 23% | 3.2E + 04 3.4E + 10 | | — |
| | Example | ↑ | Coating | Inorganic coating (silicon base)/ low hydrophilic | | | 8% 23% | 4.6E + 04 5.3E + 10 | | — |
| 7 | Comparative Example | ↑ | Coating | Acrylic/ high hydrophilic | Sputtering | In | 8% 23% | 2.7E + 03 1.7E + 06 | Base material surface character (hydrophilic) ineffective | — |
| | Comparative Example | ↑ | Coating | Acrylic/ medium hydrophilic | | | 8% 23% | 3.0E + 03 2.6E + 06 | | — |
| | Comparative Example | ↑ | Coating | Acrylic/ low hydrophilic | | | 8% 23% | 1.1E + 03 0.38E + 06 | | — |
| 8 | Example | ↑ | Coating | Inorganic coating (amorphous TiO$_2$) | Vapor Deposition | In | 3.62% | 8.12E + 10 | TiO$_2$ undercoating effective | — |
| | Comparative Example | ↑ | Coating | Acrylic | | | 3.99% | 3.83E + 01 | | — |
| | Comparative Example | ↑ | — | Directly on base material | | | 3.89% | 3.26E + 01 | | — |
| 9 | Example | ↑ | Coating | Inorganic coating (silicon base)/ drying for 6H at room temperature | Vapor Deposition | In | 2.11% | 8.96E + 09 | Drying condition of undercoating effective | — |
| | Example | ↑ | Coating | Inorganic coating (silicon base)/ drying for 2H at 80° C. | | | 2.09% | 1.52E + 10 | | — |
| | Example | ↑ | Coating | Inorganic coating (silicon base)/ drying for 4H at 150° C. | | | 2.23% | 1.21E + 11 | | — |
| 10 | Comparative Example | ↑ | Coating | Acrylic hard coating | Vapor Deposition | Cr | 2.14% | 1.15E + 01 | Hard coating ineffective | — |
| | Comparative Example | ↑ | Coating | Acrylic | | | 1.53% | 1.26E + 01 | | — |
| | Comparative Example | ↑ | — | Directly on base material | | | 1.61% | 1.47E + 01 | | — |

<Group No. 1>

In this example, a Cr coating was deposited by using a vacuum vapor deposition on an undercoating of $SiO_2$ that was deposited by using a vacuum vapor deposition so as to attain a light transmittance of 26 to 29%. As comparative examples, one in which a Cr coating was similarly deposited directly on a PC base material and one in which a Cr coating was similarly deposited on an undercoating made by coating the base material with a polyester coating material were produced. Because the electrical resistance of the Cr coating in the example was high (a discontinuous structure), the effectiveness of the $SiO_2$ undercoating was confirmed.

<Group No. 2>

In this example, an In coating was deposited by using a vacuum vapor deposition on an undercoating of $SiO_2$ that was deposited by using a vacuum vapor deposition such that the light transmittance was about 4%. As comparative examples, one in which an In coating was similarly deposited directly on a PC base material and one in which an In coating was similarly deposited on an undercoating made by coating the base material with an acrylic coating material were produced. Because the electrical resistance of the In coating in the example was high, the effectiveness of the $SiO_2$ undercoating was confirmed.

<Group No. 3>

This example was produced by modifying the example in Group 2 by changing the undercoating to $TiO_2$ and changing the light transmittance of the In coating. Because the electrical resistance of the In coating in the example was high, the effectiveness of the $TiO_2$ undercoating was confirmed.

The morphology (fine structure) of the deposited In coating of these Groups 2 and 3 was observed by using a microscope. In FIG. 2 to FIG. 4, the portion that appears black (background) is the surface of the undercoating, which is the base material, and the granular portion that appears white is the sheen of the metal In particles.

FIG. 2 shows the surface of the In coating of the example in Group 2 (which has an undercoating of $SiO_2$, a light transmittance of 4.02%, and an electrical resistance value of 6.38E+12Ω/□). An extremely fine and discontinuous sea-island structure has been established.

FIG. 3 shows the surface of the In coating of the comparative example (which has an undercoating of an acrylic coating material, a light transmittance of 3.99%, and an electrical resistance value of 3.26E+01 Ω/□). In comparison to the example in FIG. 2 described above, a structure has been established in which the organization is coarse and some parts are joined (continuous).

FIG. 4 shows the surface of the In coating of the example in Group 3 (which has an undercoating of $TiO_2$, a light transmittance of 3.92%, and an electrical resistance value of 5.46E+11 Ω/□). Similar to the example in FIG. 2 described above, an extremely fine and discontinuous sea-island structure has been established.

<Group No. 4>

In this example, an In coating was deposited by using sputtering on an undercoating made by coating the base material with an inorganic coating material whose principal component was silicon. The In coating was deposited so as to form three layers having respective light transmittances of 8%, 14%, and 23% (all average values). As the light transmittance becomes higher, which means that as the coating becomes thinner, the electrical resistance tends to increase. As comparative examples, one in which an In coating was similarly deposited in three layers on an undercoating made by coating the base material with an organic coating that was a mixture of acrylic and polyester and one in which an In coating was similarly deposited in three layers directly on a glass base material were produced. The examples and the comparative examples at the same light transmittance were compared respectively, and for all of the light transmittances, it was confirmed that the electrical resistances of the In coating in the examples was high in comparison to the comparative examples in which an organic coating film was used. In addition, it was further confirmed that the electrical resistance of the examples was equal to or greater than in the comparative examples in which an inorganic glass base material was used as well. Thereby the effectiveness of the $SiO_2$ undercoating was confirmed.

<Group No. 5>

This example was produced by modifying Group 4 such that a Cr coating was deposited by using vacuum vapor deposition to attain a light transmittance of 26 to 29%. As comparative examples, one in which a Cr coating was similarly deposited on an undercoating that was formed by coating the base material with an acrylic coating material and one in which a Cr coating was similarly deposited directly on a PC base material were produced. The electrical resistance of the Cr coating in the example was high, and the effectiveness of the $SiO_2$ undercoating was thereby confirmed.

<Group No. 6>

These examples were produced by modifying Group 4 such that the hydrophilic property of the undercoating, which was made by coating the base material with an inorganic coating whose principal component was silicon, was varied at three levels: high, medium, and low. Even when the hydrophilic property was varied, the electrical resistance of all the examples was high and no significance differences were found. It was thereby understood that the hydrophilic property was weakly related to the discontinuous structure.

<Group No. 7>

This group consisted entirely of comparative examples. These comparative examples were produced by modifying Group 6 such that the undercoating was replaced by an undercoating made by coating the base material with an acrylic coating material and the hydrophilic property was similarly varied at three levels: high, medium, and low. Even when the hydrophilic property was varied, the electrical resistance of all of the comparative examples was low and no significant differences were found. It was there by understood that the hydrophilic property was weakly related to the discontinuous structure.

<Group No. 8>

In this example, an In coating was deposited by vacuum vapor deposition on the undercoating formed by coating the base material with an amorphous $TiO_2$ inorganic coating material such that the light transmittance was somewhat less than 4%. As comparative examples, one in which an In coating was similarly deposited on an undercoating made by coating the base material with an acrylic coating material and one in which an In coating was similarly deposited directly on a PC base material were produced. Because the electrical resistance of the In coating in the example was high, the effectiveness of the $TiO_2$ undercoating was confirmed.

<Group No. 9>

In this example, after forming the undercoating by coating the base material with an inorganic silicon coating material, the undercoating underwent treatment in three drying conditions; 1) drying for 6 hours at room temperature; 2) baking for 2 hours at 80° C.; and 3) baking for 4 hours at 150° C.

Subsequently, an In coating was deposited by vacuum vapor deposition on these undercoatings. As the temperature during baking and drying increased, the electrical resistance of the In coating also increased. Thereby, the presence of the effect was confirmed under drying conditions.

<Group No. 10>

This group consisted entirely of comparative examples. In these comparative examples, the case in which a rigid acrylic hard coating was used in the undercoating was compared to the case of a normal acrylic coating material and the case of a PC base material to ascertain whether or not there was any change. However, it was found that an acrylic material was not effective even when hardened.

Next, as shown in TABLE 2, from experiment No. 1, it was confirmed that even when the $SiO_2$ undercoating deposited by vacuum vapor deposition was an extremely thin 7 nm, the electrical resistance of the In coating deposited thereon by using vacuum vapor deposition was sufficiently high, and that this undercoating was effective. It is considered that this effect would be present even if the undercoating were less than 7 nm, but because of control difficulties related to uniform continuous coating production, this is not practically useful.

of a discontinuous structure and an organic undercoating hinders formation of a discontinuous structure was confirmed.

Note that the present invention is not limited by the examples described above, and the present invention may be practiced after suitable modifications within a range that does not depart from the spirit of the present invention.

What is claimed is:

1. A manufacturing method for a resin product, comprising steps of:
    forming an inorganic undercoating that comprises an inorganic compound on the resin base material, the inorganic undercoating being a thin film made of a metallic compound, and the metallic compound comprising at least one of a silicon compound and a titanium compound; and
    depositing a metallic coating directly on the inorganic undercoating by using a physical vapor deposition method, said metallic coating comprising at least one of chromium and indium and having a sheen and a discontinuous structure in which many fine metal particles are spread over the surface of the inorganic undercoating in a state in which the particles are slightly separated from each other.

TABLE 2

| Experiment No. | | Comparative Example | 1 | 2 | 3 | 4 | 5 |
|---|---|---|---|---|---|---|---|
| Coating Structure | Base material | PC | ← | ← | Glass Material | ← | ← |
| | Undercoating | None | $SiO_2$ vapor deposition at 7 nm | $Si_3N_4$ vapor deposition at 10 nm | Acrylic 30/ Silicon 100 coating | Acrylic 10/ Silicon 100 coating | Acrylic 0/ Silicon 100 coating |
| | Metallic Coating | In vapor deposition at 60 nm | ← | ← | ← | ← | ← |
| Result | Light Transmittance (@ 550 nm) | 3.89% | 4.47% | 6.78% | 2.45% | 2.61% | 2.42% |
| | Electrical Resistance (Ω/□) | 3.26E + 01 | 7.31E + 12 | 2.96E + 12 | 1.53E + 08 | 2.07E + 10 | 3.50E + 10 |

In addition, as shown in TABLE 2, from experiment No. 2, an effectiveness similar to that of $SiO_2$ was confirmed for the $Si_3N_4$ undercoating deposited by using vacuum vapor deposition.

Furthermore, as shown in TABLE 2, in experiments No. 3 to No. 5, an undercoating was coated and formed by using a coating material in which the acrylic resin coating material was mixed in three steps of 50 mass units, 10 mass units, and 0 mass units per 100 mass units of inorganic silicon resin coating material, and the effect of an organic material that was mixed into the inorganic undercoating on the electrical resistance value of the above In coating was investigated. As a result, it was determined that the electrical resistance value of the In coating decreased as the mixing amount of the acrylic resin coating material increased. Based on this result, the conjecture described above about the mechanism by which the metallic coating acquires a discontinuous structure (sea-island structure) was confirmed. Specifically, the mechanism by which an inorganic undercoating promotes the formation 2. A manufacturing method for a resin product comprising steps of:
    forming an inorganic undercoating that comprises an inorganic compound on the resin base material, the inorganic undercoating being a coating film made of an inorganic coating material, and the inorganic coating material comprising at least one of an inorganic silicon coating material and an amorphous titanium oxide inorganic coating material; and
    depositing a metallic coating directly on the inorganic undercoating by using a physical vapor deposition method, said metallic coating comprising at least one of chromium and indium and having a sheen and a discontinuous structure in which many fine metal particles are spread over the surface of the inorganic undercoating in a state in which the particles are slightly separated from each other.

3. The manufacturing method for a resin product according to claim 2, wherein the coating film made of the inorganic coating material is baked after coating.

* * * * *